(12) United States Patent
Yagi et al.

(10) Patent No.: US 6,942,817 B2
(45) Date of Patent: Sep. 13, 2005

(54) METHOD OF MANUFACTURING WIRELESS SUSPENSION BLANK

(75) Inventors: Hiroshi Yagi, Tokyo (JP); Shigeki Kawano, Tokyo (JP); Kazuo Umeda, Tokyo (JP); Jiro Takei, Tokyo (JP); Yukio Iimura, Tokyo (JP); Satoshi Sasaki, Tokyo (JP); Katsuya Sakayori, Tokyo (JP); Hiroko Amasaki, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/813,759

(22) Filed: Mar. 21, 2001

(65) Prior Publication Data

US 2002/0027127 A1 Mar. 7, 2002

(30) Foreign Application Priority Data

Mar. 24, 2000 (JP) ........................................ 2000-085045
Jul. 7, 2000 (JP) ........................................ 2000-206195
Jul. 7, 2000 (JP) ........................................ 2000-206196

(51) Int. Cl.$^7$ ........................ B44C 1/22; C03C 15/00; C03C 25/68; C23F 1/00; G11B 21/16
(52) U.S. Cl. ........................ 216/57; 216/13; 118/723 E; 438/108; 360/244.3; 360/245.9; 360/245.4; 360/294.7
(58) Field of Search ................. 216/57, 13; 118/723 E; 438/108; 360/244.3, 245.9, 245.4, 294.7

(56) References Cited

U.S. PATENT DOCUMENTS 5,628,869 A * 5/1997 Mallon .................... 118/723 E
5,839,193 A * 11/1998 Bennin et al. ............. 29/895.9
5,970,319 A * 10/1999 Banks et al. ................ 438/108
6,093,476 A * 7/2000 Horiuchi et al. ............ 428/209

FOREIGN PATENT DOCUMENTS

JP 2000-49195 2/2000

* cited by examiner

Primary Examiner—Rudy Zervigon
(74) Attorney, Agent, or Firm—Flynn, Thiel, Boutell & Tanis, P.C.

(57) ABSTRACT

A wireless suspension blank is made using a two-layer laminate composed of a metallic layer with the spring property and an electrically insulating layer. The first method includes a first step for working the metallic layer by the photo etching method, a second step for forming a wiring part on the insulating layer by the semi-additive method and a third step for working the insulating layer by the wet-etching method. The second method includes a first step for working the metallic layer by the photo etching method, a second step for forming a wiring part on the insulating layer by the semi-additive method and a third step for working the insulating layer by the plasma etching method. The third method includes a first step for forming a wiring part on the metallic layer by the semi-additive method, a second step for working the metallic layer by the wet-etching method and a third step for working the insulating layer by the dry-etching method or the wet-etching method. The use of a two-layer laminate makes possible a low cost production. Further, the forming of a wiring part by the semi-additive method makes possible to working very accurately a fine wiring part.

17 Claims, 9 Drawing Sheets

PRIOR ART

FIG. 5
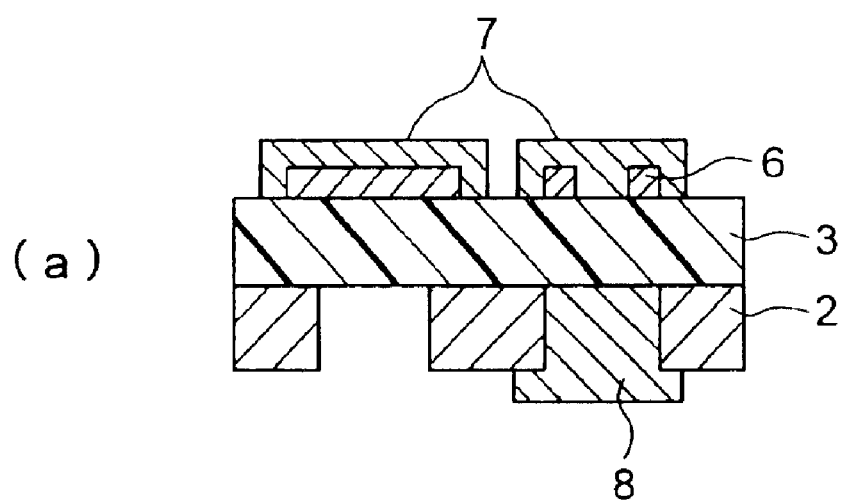
(a)
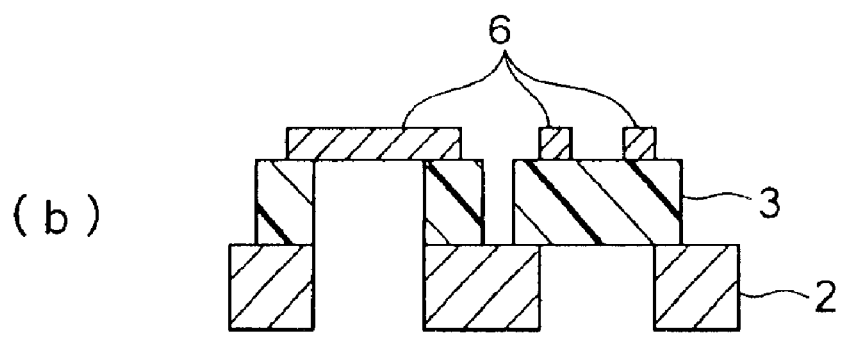
(b)
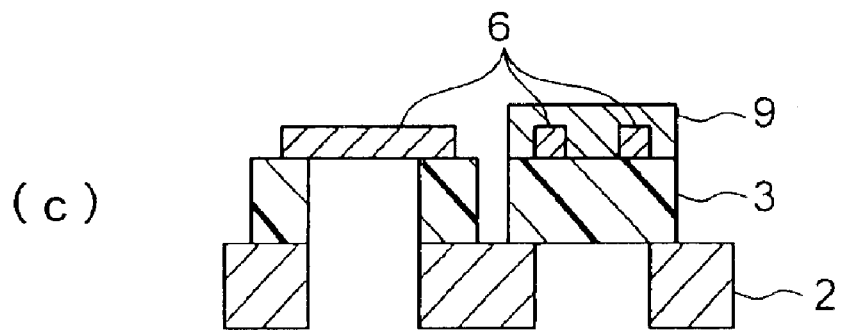
(c)

FIG. 10
(a) 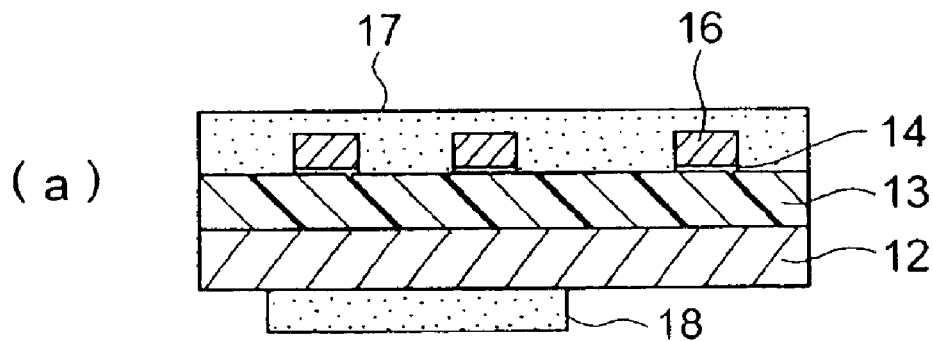
(b) 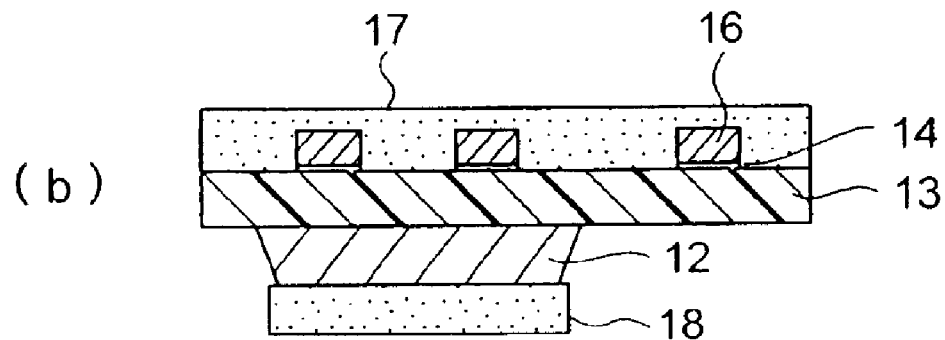
(c) 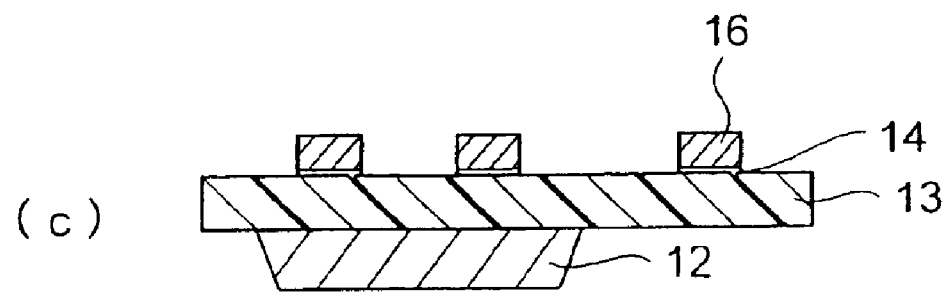

FIG. 11
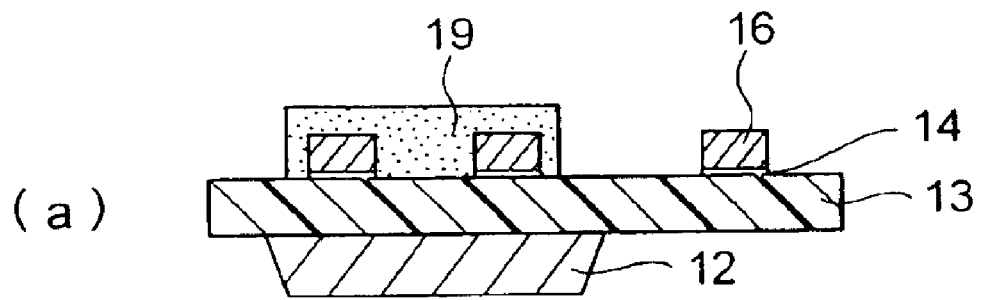
(a)
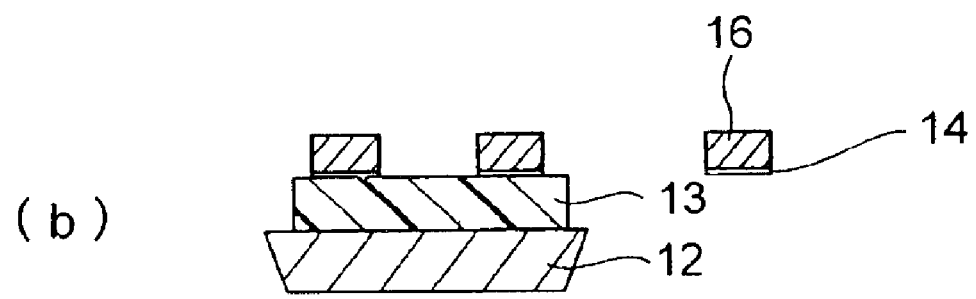
(b)
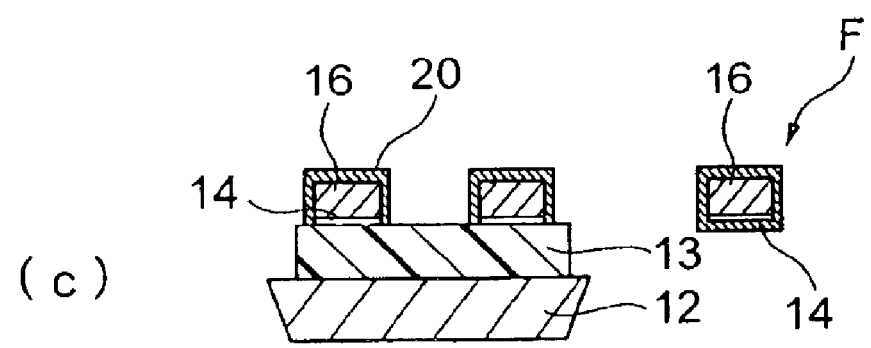
(c)

METHOD OF MANUFACTURING WIRELESS SUSPENSION BLANK

The present invention relates to a method of manufacturing a wireless suspension blank used in a hard disc drive (hereafter called "HDD") as a data storage device and the like.

BACKGROUND OF THE INVENTION

Prior art concerning such a method of manufacturing the above-mentioned member for electric parts is mentioned in Japanese Patent Laid-open 2000-49195 (Title of Invention: "Process for making a member for electric parts"), in which a method of manufacturing a wireless suspension blank used for HDD is not concretely explained on a method of manufacturing a wireless suspension blank. However, a method of manufacturing a member for electric parts is disclosed as follows.

In the method, a three-layered laminate composed of a polyimide resin film and metallic foils laminated on both sides of the polyimide resin film is used as a laminate. In the process, resist patterns are formed on the metallic foils laminated on both sides of the polyimide, respectively, and the two metallic foils are treated at the same time by etching solution. Thereafter, resist patterns are removed from the two metallic foils, and then plasma etching of the polyimide resin film is made through one metallic foil etched as a mask to form the polyimide resin film into a pattern. Thereafter, the metallic foil used as a mask is removed from the polyimide resin film. As a result, a member for an electronic part can be obtained which is composed of a laminate of the polyimide resin film formed into a pattern and the metallic foil formed into a pattern. This effect is that the low-cost production is possible since reproduction occurs only once and high quality product can be obtained in which a pattern of polyimide resin film is laminated on a pattern of metallic foil with a high positioning accuracy.

However, the above-mentioned process has a first problem in that the three-layered laminate used is high-priced.

Further, the above-mentioned process has a second problem in that working of metallic foil is difficult where finer working accuracy is required, since wet etching is made to the metallic foils laminated on both sides of polyimide resin film of three-layered laminates.

Further, the above-mentioned process has another problem in that flying leads used in checking the action of a magnetic head cannot be formed in a state wherein both sides thereof are exposed to the air.

Further, working of polyimide resin film of the insulating layer is carried out by the dry etching method such as the plasma etching method. However, dry etching has the following basic problem.

FIG. 1 is a schematic illustration of a plasma etching system used for dry etching. The conventional plasma etching system has a flat-plate type of cathode electrode 23, in which cooling pipe 22 is passed. The cathode electrode is secured to a vacuum chamber 21 through RF electrode material 24, and the cathode electrode 23 is connected with power supply 27 through RF introducing pipe 25 and blocking condenser 26. Further, a flat-plate type of anode electrode 28 is arranged parallel with the cathode electrode 23 above the cathode electrode, in which working gas is introduced from the whole surface of the anode electrode 28 and through a gas introducing pipe 29. Further, anode electrode 28 and vacuum chamber 21 are grounded electrically.

In the above-mentioned conventional plasma etching system, dry etching is carried out at a state that a laminate is put on the flat-plate type of cathode electrode 23. In case of polyimide resin film being dry-etched, usually, working of polyimide resin film at high temperature enables higher working speed and high throughput. Therefore, working of polyimide resin film is carried out generally at a temperature in the region of glass transition temperature (Tg) of polyimide resin. However, the laminate of the wireless suspension blank has different metallic materials on both sides. Therefore, if working temperature is in the region of Tg of polyimide resin, curving of the laminate is caused by the very small difference between thermal expansion coefficients of metals so that working efficiency is lowered by local thermal distribution caused by curving of the laminate. Namely, there is a problem that as shown in FIG. 2, a center of the laminate S goes up, in such an extent that the laminate S does not come into contact with cathode electrode 23, and therefore high throughput working becomes impossible.

DISCLOSURE OF INVENTION

The present invention was made considering the above-mentioned technical problems. An object of the present invention is to provide a method of manufacturing a wireless suspension blank in which a highly accurate method is possible.

In order to achieve this object, a first method of the present invention is a method of manufacturing a wireless suspension blank using a two-layered laminate composed of a metallic layer with a spring property and an electrically insulating layer, wherein the method comprises a first step for making the metallic layer by the photo etching method, a second step for making a wiring part on the insulating layer by the semi-additive method, and, a third step for working an insulating layer by the wet etching method.

In the first method of the present invention, it is desirable to use polyimide resin as the insulating layer.

Further, in the third step of the first method of the present invention, wet etching of the insulating layer may be made from any of the metallic layer side and the wiring part side, or from both sides thereof.

Further, in order to achieve the same object, a second method of the present invention involves a method of manufacturing a wireless suspension blank using a two-layered laminate composed of a metallic layer with the spring property and an electrically insulating layer, wherein the method comprises a first step for working the metallic layer by the photo etching method, a second step for forming a wiring part by the semi-additive method; and, a third step for working the insulating layer by the plasma etching method.

In the second method of the present invention it is also desirable to use polyimide resin as the insulating layer.

Further, in the method of the present invention, when plasma-etching the insulating layer, it is desirable to plasma-etch the insulating layer using an electrode having a shape with curvature.

Further, in order to achieve the same object, a third method of the present invention involves a method of manufacturing a wireless suspension blank using a two-layered laminate composed of a metallic layer with the spring property and an electrically insulating layer, wherein the method comprises a first step for forming a wiring part by the semi-additive method, a second step for working the metallic layer which is processed by the wet etching method, and a third sep for working the insulating layer either by the dry etching method or the wet etching method.

In the third method of the present invention, it is also desirable to use polyimide resin as the insulating layer.

Further, in the third method of the present invention, it is desirable to form a flying lead in the third step.

BRIEF DESCRIPTION OF THE DRAWINGS

FIGS. 4 and 5 are method drawings showing the production procedure of the wireless suspension blank for HDD according to the first and the second method of the present invention, respectively.

FIGS. 9, 10 and 11 are process drawings showing the working procedures of a wireless suspension blank for HDD according to the third method of the present invention.

DETAILED DESCRIPTION

Figure 1:
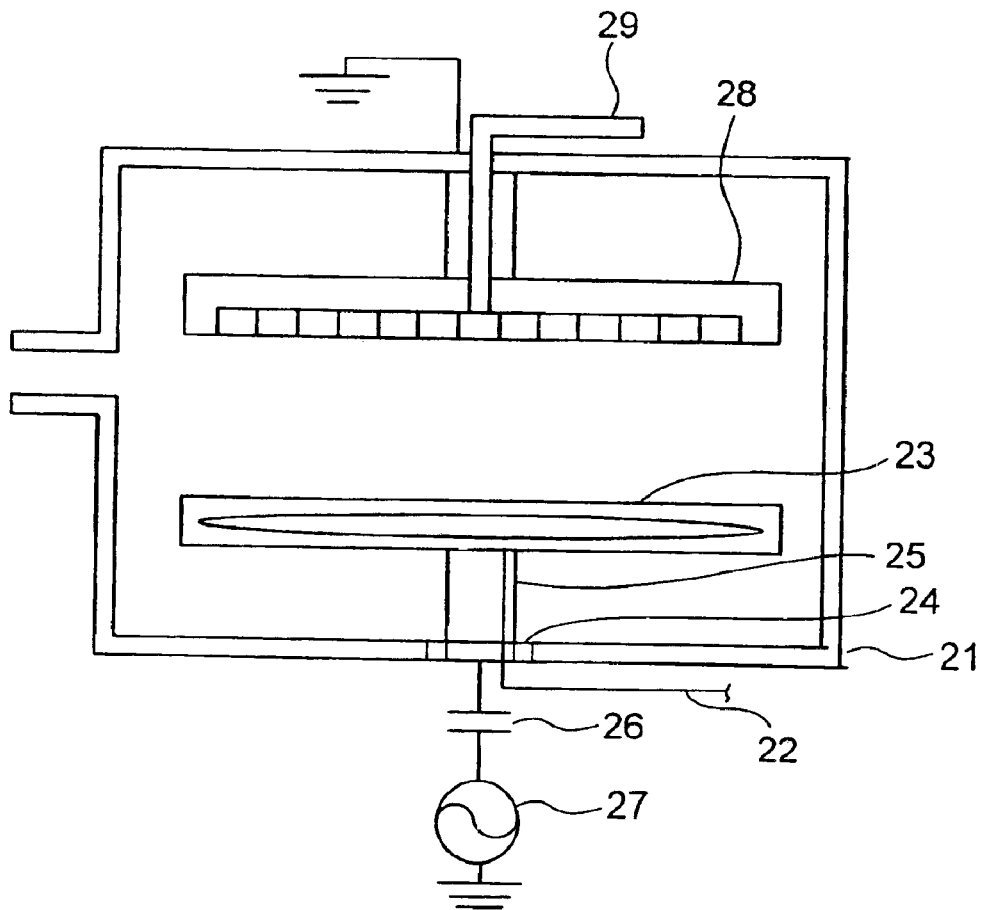
FIG. 1 is a schematic illustration of a plasma etching system.
Figure 2:
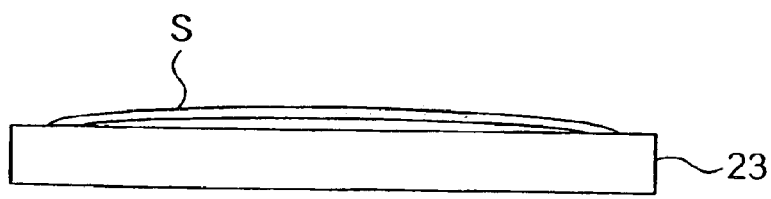
FIG. 2 is an explanatory drawing showing a state where a laminate is curved in the case of the plasma etching system shown in FIG. 1 being used.

In order to explain in detail the present invention, referring to the drawings appended, the present invention is illustrated concretely.

The Method (1) of the Present Invention

Figure 3:
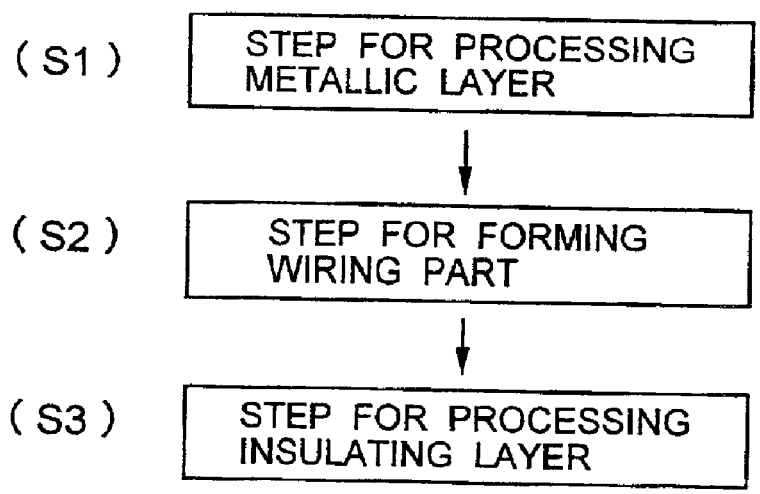
FIG. 3 is a flow diagram showing a basic procedure in a method of manufacturing a wireless suspension blank for HDD, for explaining the first and second methods of the present invention.

In the first method of the present invention, a wireless suspension blank shown in FIG. 3 is made using a two-layer laminate composed of a metallic layer with a spring property or characteristic and an electrically insulating layer. Namely, first, the working step of metallic layer is carried out in Step 1 (S1), and then the forming step of a wiring part is carried out in Step 2 (S2). Finally the working step of the insulating layer is carried out in Step 3 (S3).

The step 1 is a first step for working the metallic layer such as a stainless steel positioned on one side of the two-layered laminate. The step 2 is carried out after the metallic layer is processed in such a manner. The step 2 is a second step in which a wiring part is formed on an insulating layer such as a polyimide resin layer laminated on the metallic layer by plating metals such as copper by the semi-additive method. The following step 3 is a third step in which a resist pattern is formed for working the insulating layer and thereafter the insulating layer is worked according to the resist pattern by wet-etching. A wireless suspension blank is made through these three steps.

Figure 4:
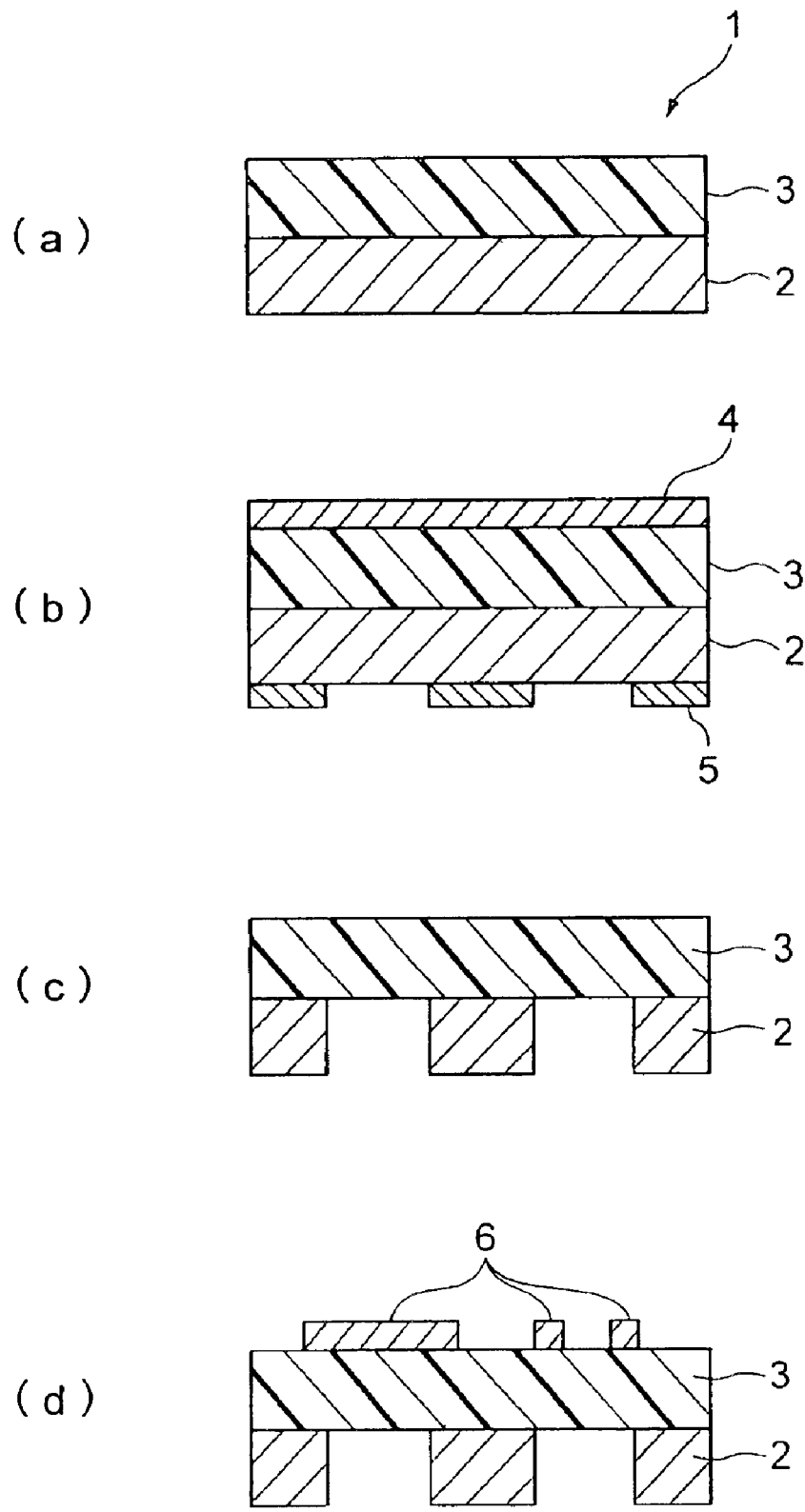

FIGS. 4 and 5 are process drawings showing the working procedures of the wireless suspension blank for a HDD according to the first method of the present invention. Then, the respective steps are explained in order.

FIG. 4(a) shows laminate 1 for making a wireless suspension blank for HDD according to the first method. The laminate 1 is composed of a stainless steel as metallic layer 2 with the spring property and an insulating layer 3 put on the metallic layer. The insulating layer 3 is composed of polyimide resin film as core-insulating layer and an adhesive layer, in which the core insulating layer is laminated with metallic layer 2 through the adhesive layer.

A concrete example is as follows: polyimide resin film with thickness 12.5 $\mu$m("APIKAL NPI" manufactured by Kanefuchi Chemical Co, Ltd.) is used as insulating layer. Polyimide varnish ("EN-20" manufactured by Shin Nippon Rika Co, Ltd.) as a material of insulating layer is applied on the polyimide resin film in such a manner that the thickness of film of after drying comes to 2.5±0.3 $\mu$m to form a film with an adhesive layer (insulating layer 3). The film with adhesive layer is laminated with stainless steel foil ("304HTA foil" manufactured by Shin Nippon Seitetu Co, Ltd.). Thereafter, pressure of I MPa is applied on the film with adhesive layer and stainless steel at 300° C. for 10 min in a vacuum so that a laminate is obtained.

FIG. 4(b) shows a state where after resists 4 are applied on the upper face of insulating layer 3 and the lower face of metallic layer 2 in laminate 1, respectively, a resist pattern 5 is formed on metallic layer 2 by exposing the resist applied on the lower face of the metallic layer to light and developing the resist.

There is given a concrete example where after dry film resists ("AQ-5038" manufactured by Asahi Chemical Co., Ltd.) are applied on the upper face of insulating layer 3 and the lower face of metallic layer 2 in laminate 1, respectively, at 100° C., a resist laminated on the lower face of the stainless steels is exposed through a given photomask to light and developed to form a resist pattern. Exposing is carried out by using g rays with a quantity of exposing rays of 3~60 mJ/cm$^2$, and the development is carried out by spraying 1 wt % of Na2CO3 solution to the resist at 30° C., in which dry film resist is preferably used as resist. However, liquid resist such as casein may be used.

FIG. 4(c) shows a state where one side of stainless steel is etched using general etching solution of ferric chloride by the one side lapping method, and then resists 4, 5 are removed from stainless steel by peeling solution of sodium hydroxide. By this, a two-layer laminate having metallic layer 2 formed into a shape on one side of insulating layer 3 can be obtained.

FIG. 4(d) shows a state where a wiring part 6 is formed by forming a pattern of conductive material on the side of insulating layer 3 opposite to the side of metallic layer 2. In this case, a feeding layer is formed on the upper face of insulating layer 2. Resist of photosensitive material is applied on the upper face of insulating layer 3 and the face of metallic layer 2 having worked pattern. Thereafter the resist formed on insulating layer 3 is exposed through a given photomask pattern to light and developed to form a resist pattern. Then, copper is deposited on an area of the feeding layer on insulating layer 3 exposed through the photomask pattern by plating with the feeding layer. Thereafter, the resist pattern and an area of the feeding layer under the resist pattern are removed.

FIG. 5(a) shows a state where in order to work insulating layer 3 by the wet etching method, resist layers 7 and 8 for working insulating layer are formed on an area of insulating layer to be left on the upper face of insulating layer 3 on which a wiring part is formed and the lower face of insulating layer on which metallic layer 2 is formed. For this object, resists 7, 8 for working insulating layer are formed by the dip-coating method, the roll coating method, the die-coating method, or the laminating method. Thereafter, the resist layers are exposed to light through a given mask pattern.

There is given a concrete example in which dry film resists ("AQ-5038" manufactured by Asahi Chemical Co., Ltd.) are laminated on the upper face of insulating layer and the lower face of metallic layer 2. Exposure is carried out by g rays with a quantity of exposing rays of 30~60 mJ/cm$^2$, and the development is carried out by spraying 1 wt % of Na2CO3 solution on the resist at 30° C. to form resist patterns, in which the forming of resist layers for working insulating layer may be carried out not by exposing the resists to light and developing the resist, but by the printing method.

FIG. 5(b) shows a state where insulating layer 3 is worked by wet-etching the laminate with resist patterns through the resist patterns. In this case, working of insulating layer by wet etching may be carried out with every side of the laminate, or at the same time with both sides. After wet-etching, resist layers 7, 8 for working insulating layer used as masks are removed from the laminate, and working of insulating layer 2 is finished. The stripping of resist is carried out generally at 50° C. in hot alkaline solution of 3 wt % of sodium hydroxide. However, in the case of using polyimide resin which is poor in alkali resistance, organic alkali such as ethanolamine may be used as a stripping solution.

FIG. 5(c) shows a state where Au as finishing up of working is plated on wiring part 6 in the laminate formed as above-mentioned, and besides cover layer 9 of epoxide resins and others as protective layer is formed. The Au plating is a surface treatment for electrical connection between a magnetic head slider (not shown) and a suspension and for electrical connection between the suspension and a control side. Au plating is desirable. However, protective material is not restricted to it. Ni/Au plating may be used, or a soldering plating or a printing layer may be used. For example, when Ni plating is applied, glossy plating bath, non-glossy plating bath or semi glossy plating bath can be selected.

As above-mentioned, through the procedure shown in FIGS. 4 and 5, the process of a wireless suspension blank for HDD is finished. Thereafter, although not shown, working for the assembly such as mechanical working is carried out, so that a wireless suspension blank for HDD is finished.

The Method (2) of the Present Invention

In the second method of the present invention, a wireless suspension blank is made using a two-layer laminate composed of a metallic layer with the spring property and an electrically insulating layer. Namely, the working step of metallic layer is carried out in Step 1 (S1) and then the forming step of wiring part is carried out in Step 2 (S2), and finally the working step of insulating layer is carried out in Step (S3).

Step 1 is a first step in which metallic layer such as stainless steel existing on one side of the two-layer laminate is worked by photo-etching. After the metallic layer is worked, Step 2 is carried out. The step 2 is a second step in which a wiring part is formed by plating metal such as copper on an insulating layer such as polyimide resin laminated on the metallic layer by the semi-additive method. The following step 3 is a step in which after the resist pattern for working of an insulating layer is formed, the insulating layer is worked through the resist pattern by plasma etching. Wireless suspension blank is made through these three steps.

FIGS. 4 and 5 are the production drawings showing the productive procedure of wireless suspension blank for HDD according to the second method of present invention, in which the steps of up to a step shown in FIG. 5(a) are the same as steps in the first method of the present invention. The following steps for working insulating layer differs from steps in the first method of the present invention in that working of insulating layer is carried not by the wet etching method, but by the plasma etching method. The plasma etching is preferable to be carried out by means of the plasma etching system schematically shown in FIG. 6.

The plasma etching system has a cathode electrode 23 with curved shape, through which cooling pipes 22 are passed. The cathode electrode 23 is secured to a vacuum chamber 21 through a RF insulating material 24. Further, the cathode electrode 23 is connected through RF introducing pipe 25 and a blocking condenser 26 with RF electric power 27. Further, an anode electrode 28 with the same curved shape as that of the cathode electrode 23 is arranged over the cathode electrode 23 leaving the same space between the surface of the anode electrode 28 and the surface of the cathode electrode 23. Further, working gas is introduced into the vacuum chamber 21 through gas introducing pipe 29 and through a plurality of shower electrodes 28a. Further, anode electrode 28 and vacuum chamber 21 are electrically grounded. The radius of curvature of cathode electrode 23 depends upon a size of laminate of substrate. Concretely, the above-mentioned radius of curvature is the minimum radius of curvature, which corresponds to ½ of the minimum side at which a laminate to be worked can be curved.

Although the structure for generating plasma shown here is a cathode coupling system, the anode coupling system in which RF is applied to anode electrode 28, or the hollow cathode system in which RF is applied alternately to cathode electrode 23 and to anode electrode 28 may be used. Further, although cathode electrode 23 is connected here with RF electric power 27 through blocking power 27, cathode electrode 23 may be connected directly with RF electric power 27. Further, even if the distance between cathode electrode 23 and anode electrode 28 may vary somewhat according to places, its effect is very changed.

Figure 6:
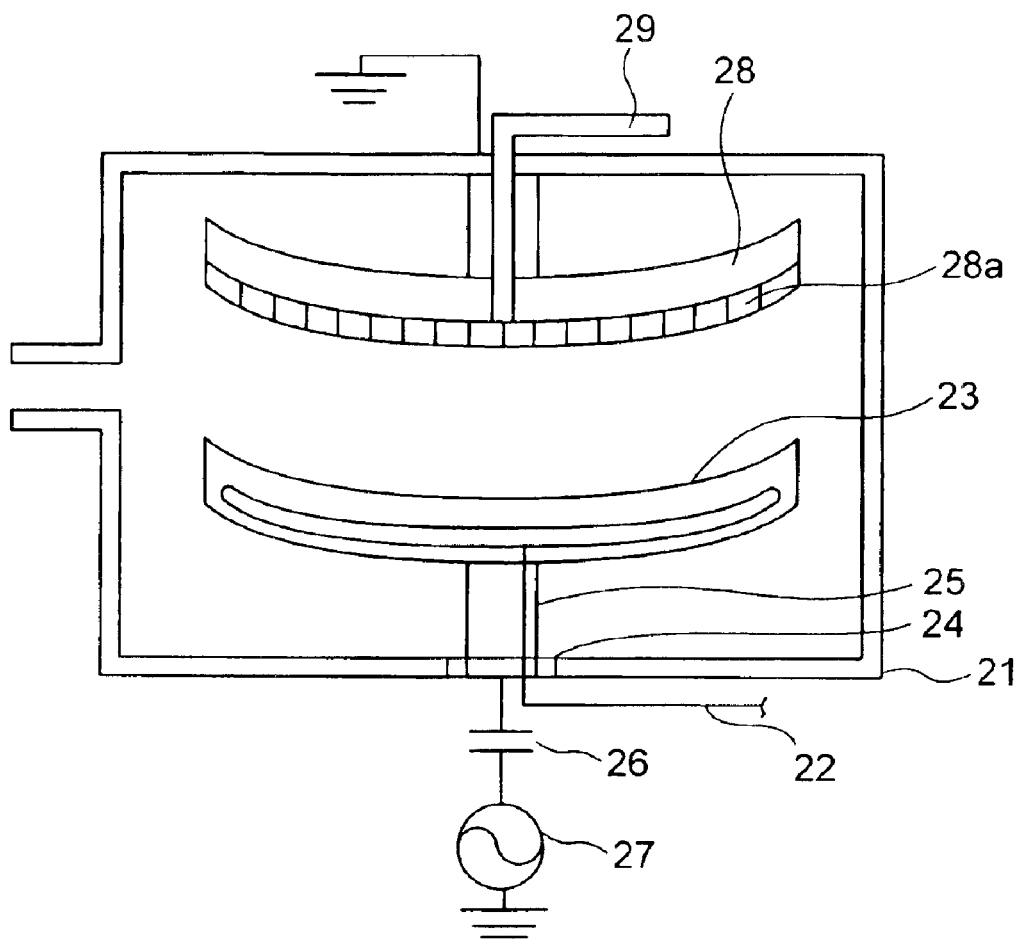
FIG. 6 is a schematic illustration of a plasma etching system used in the third method of the present invention.
Figure 7:
FIG. 7 is an explanatory drawing showing the behavior of a laminate in the case of the plasma etching system shown in FIG. 6 being used.

If etching is carried out by means of the plasma etching system shown in FIG. 6, the phenomenon of laminate 1 being curved disappears by holding down the laminate 1 itself by empty weight thereof and by the action of elasticity thereof which makes efforts to keep parallelism, so that the laminate 1 is brought into close contact with cathode electrode 23. In such a way, the phenomenon of the laminate 1 being curved disappears by using a cathode electrode with a concave portion at the center of electrode, in which a laminate to be worked is put on the electrode so that the phenomenon of laminate 1 being curved disappears by holding down the laminate 1 itself by empty weight thereof and by the action of elasticity thereof which makes efforts to keep parallelism. Accordingly, the local distribution of temperature is decreased so that working at high throughput becomes possible. In this case, the shape of cathode electrode 23 may be formed into a convex shape, in which the shape of anode electrode 28 is concave. However, the shape of cathode electrode 23 is desirably concave.

In addition to the above-mentioned content, only a part of laminate 1 may be pressed complementarily and physically, or laminate 1 may be pressed by electrostatic method.

A concrete example of working condition of plasma etching made using the plasma etching system shown in FIG. 6 is as follows: the pressure of etching gas is 2~80 Pa. Components of etching gas are oxygen as the main component, and 5~40% of CF4. Further, 1~15% of Nitrogen may be added as needed. Further, additive gas such as NF3, CHF3, SF6 can be used instead of CF4. The flow rate of etching gas is 30~3000 sccm. The more the flow rate of etching gas, the higher the etching rate shows a tendency to be. However, even if the etching gas is added over the given amount, the vacuum chamber becomes saturated with the etching gas. Therefore, the amount of etching gas is preferably adjusted to the exhaust capacity of the plasma etching system. Further, power is 0.1~2 W/cm$^2$.

After plasma-etching, as resist layers 7, 8 for working insulating layer used as mask are removed, working of insulating layer 3 is finished. The step of after working of insulating layer is in the same manner as that explained in the first method of the present invention.

The Method (3) of the Present Invention

Figure 8:
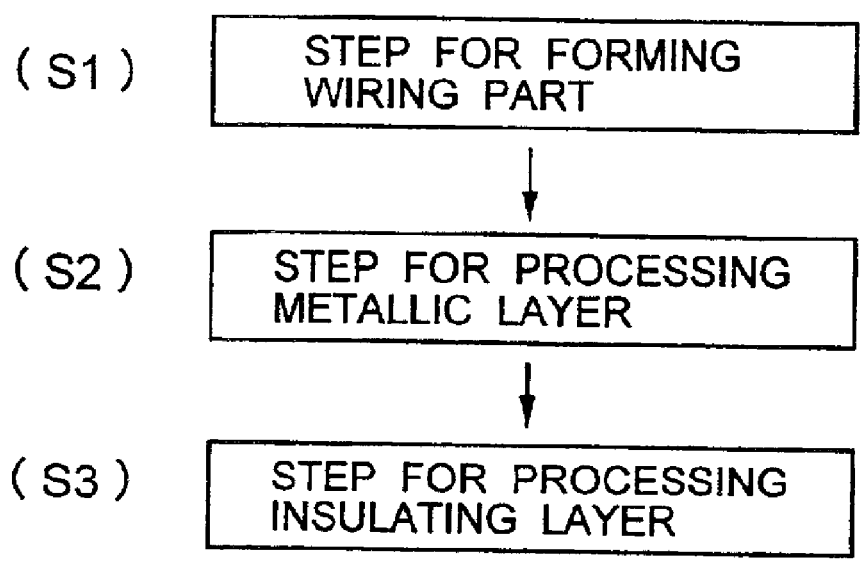
FIG. 8 is a flow drawing showing the basic production procedure in a method of manufacturing a wireless suspension blank, for explaining the third method of the present invention.

In the third method of the present invention, a wireless suspension blank is made through the steps shown in FIG. 8 using a two-layer laminate composed of a metallic layer with the spring property and an electrically insulating layer. Namely, first, the step for forming of a wiring part is carried out in Step 1 (S1), and then the step for working the metallic layer is carried out in Step 2 (S2) and the step for working the insulating layer in Step 3 (S3).

The step 1 is a first step in which a metal such as copper is plated on an insulating layer such as polyimide resin laminated on a metallic layer by the semi-additive method. The step 2 is a second step in which the metallic layer such as stainless steel positioned on one side of the two-layer laminate is worked by the wet-etching method. The following step is a third step in which the insulating layer is worked by the dry etching method or the wet etching method. These three steps are carried out in order so that a wireless suspension blank is made.

In such a manner, in the third method of the present invention, first, a wiring part is formed on an insulating layer, before a metallic layer and polyimide resin layer are worked. Accordingly, uniform under coating can be easily formed on the laminate. Further, a wiring part can be formed minutely.

Figure 9:
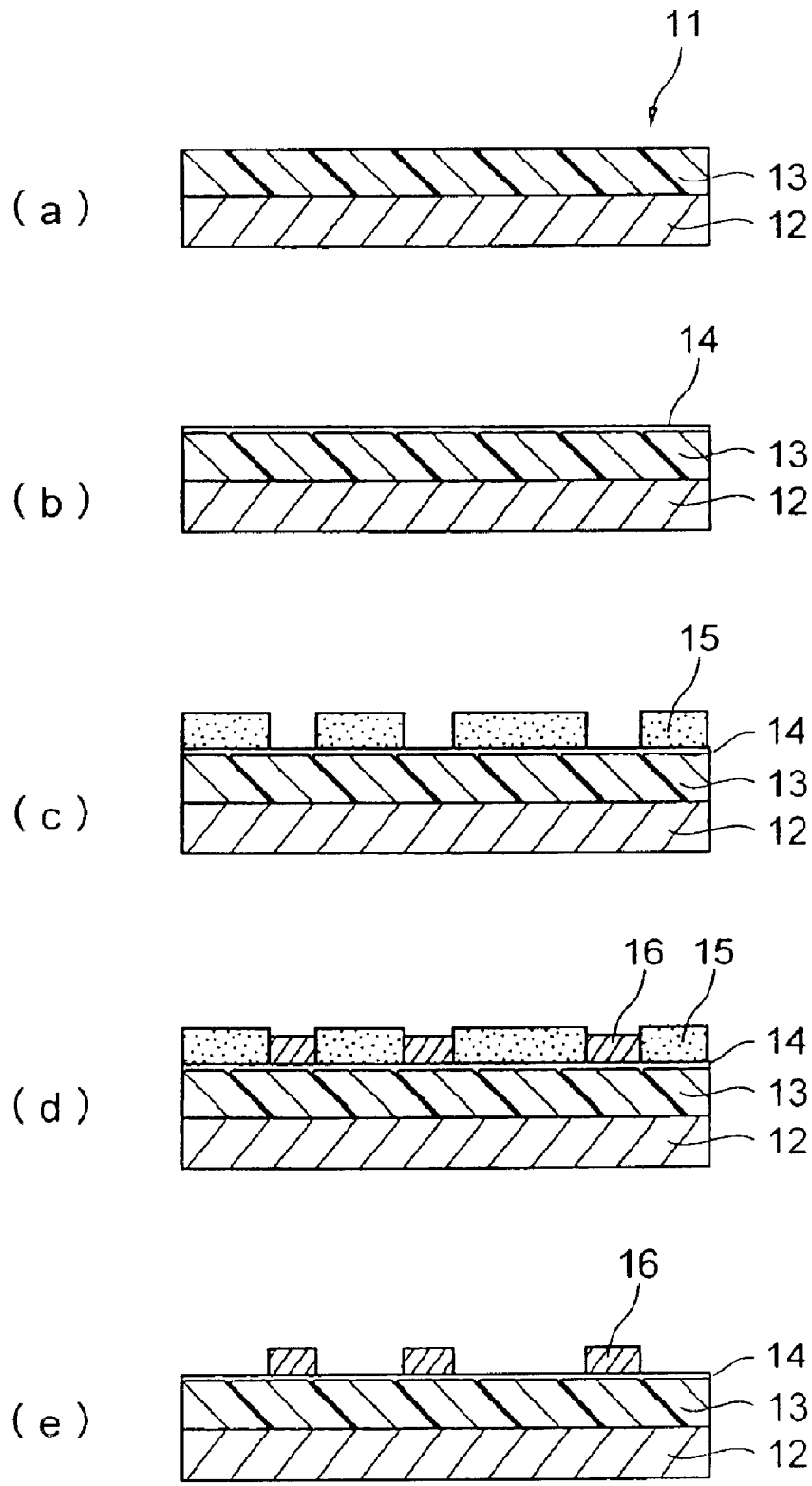

FIGS. 9 through 11 is the production drawings showing the productive procedure of a wireless suspension blank for HDD. The individual steps are explained in order. FIG. 9(*a*) shows a laminate 11 for forming a wireless suspension blank for HDD. The laminate 11 is the same one as that explained in the first method, in which an insulating layer 13 is laminated on stainless steel as a metallic layer 12 with the spring property, the insulating layer 13 being composed of polyimide resin film as a core insulating layer and adhesive layer. The metallic layer 12 is laminated through the adhesive layer on the polyimide film.

A concrete example thereof is as follows: in the same manner as that explained about the first method, polyimide resin film with thickness of 12.5 μm ("APIKAL NPI" manufactured by Kanegafuchi Chemical Co., Ltd.) is used as a core insulating layer; polyimide varnish ("EN-20" manufactured by Shin Nippon Rika Co., Ltd.) as adhesive layer is applied on the polyimide resin film in such a manner as the thickness of film of after having been dried comes to 2.5±0.3 μm, so that a film with an adhesive layer (insulating layer 13) is formed. The film with adhesive layer is laminated with stainless steel foil ("304HTA foil" manufactured by Shin Nippon Steel Corporation). Thereafter, pressure of 1 MPa is applied to the laminate of the film with adhesive layer and stainless steel at 300° C. for 10 min in a vacuum to form a two-layer laminate 11.

First, a wiring part is formed on the laminate 11. For this, first, as shown In FIG. 9(*b*), under coating 14 for a wiring part is formed on an insulating layer 13, in which the under coating is formed by sputtering, chemical plating and others.

A concrete example thereof is as follows: dry film resists ("AQ-5038" manufactured by Asahi Chemical Co., Ltd.) are laminated on both side of the laminate 11 at 100° C.; and a resist laminated on the lower face of the stainless steel is exposed through a given mask pattern to light. The exposure is carried out by g-rays with the exposure of 30~60 mJ/cm$^2$ to form a resist pattern. The development is carried out by spraying 1 wt % of Na2CO3 solution on the exposed resist at 30° C. Dry film resist is preferably used as resist. However, liquid resist such as casein can be used.

Then, a pattern of additive copper forming a wiring part 16 is formed by using under coating 14 formed on insulating layer 13, as shown in FIG., 9(*d*). Thereafter, dry film resist 15 is removed from the laminate, and then exposed portions of under coating 14 are etched to remove, by which wiring part 16 is formed on insulating layer 13, as shown in FIG. 9(*e*).

After wiring part 13 has been formed on insulating layer 13, the working of metallic layer 12 positioned on the lower side of the insulating layer 13 is carried out. For this, first, as shown in FIG. 10(*a*), dry film resist 17, 18 are laminated on both sides of the laminate 11. Therefore, resist 18 is laminated on the lower face of the metallic layer 12.

A concrete example thereof is as follows: in the same manner as above-mentioned, dry film resists ("AQ-5038" manufactured by Asahi Chemical Co., Ltd.) are laminated on both sides of the laminate at 100° C.; thereafter, resist laminated on the lower face of stainless steel is exposed through a given mask pattern to light and developed to form a pattern, in which the exposure is carried out by g-rays with the exposure of 30~60 mJ/cm$^2$, and the development is carried out by spraying 1 wt % of Na2CO3 on the resist at 30° C. Dry film resist is preferably used as resist. However, liquid resist such as casein can be also used as resist.

Thereafter, as shown in FIG. 10(*b*), one side of stainless steel is etched with general etching solution of ferric chloride by the one side lapping method. Thereafter, as shown in FIG. 10(*c*), resists 7 and 8 are removed from the laminate by stripping solution of sodium hydroxide. By this, a laminate is obtained in which a wiring part 16 is formed on one side of insulating layer 13, and metallic layer 12 is formed into a pattern.

Finally, working of insulating layer 13 is carried out for the above-mentioned laminate in which a wiring part 16 is formed and metallic layer 12 is worked. As to the method of working the metallic layer, the dry etching method can be applied, or the wet etching method can be applied.

In case of etching working of insulating layer in any method, as shown in FIG. 11(*a*), resist 19 for working insulating layer is formed on the upper face of insulating layer 13 with a wiring part 16, while resist for working insulating layer (not shown) is formed on the lower face of the insulating layer, in such a manner that areas of the insulating layer to be left are covered with the resists for working insulating layer. For this, resist 19 for working insulating layer are deposited on both sides of the laminate. After the resists are exposed through a given mask pattern, the resists are developed.

A concrete example thereof is as follows: dry film resists ("AQ-5038" manufactured by Asahi Chemical Co., Ltd.) are laminated at 100° C., The exposure is carried out by g-rays with the exposure of 30~60 mJ/cm$^2$, and the development is carried out by spraying 1 wt % of Na2CO3 on the resist, in which resist 19 for working insulating layer can be formed not by the resist-exposing and developing method, but by the printing method.

FIG. 11(*b*) shows a state where insulating layer 13 is worked by dry etching or wet etching, and thereafter resist layers for working insulating layer are removed from the laminate. As shown in FIG. 11(*c*), Au plating 20 is applied for finishing on a wiring part 16 in the laminate formed as mentioned above. The Au plating is the surface treatment for the connection between a magnetic head slider and a suspension and for the connection between the suspension and a control side. Au plating is desirable, however the treatment is restricted to it. Ni/Au plating can be applied for, or there is a case where solder plating or printing is be used for Au plating. For example, in case of Ni plating being applied, glossy plating bath, non-glossy plating bath and semi-glossy plating bath can be selected.

Further, cover layers such as an epoxide resin layer as a protective layer are formed on the necessary areas of the wiring part 16, by which the production of a wireless suspension blank is finished. Thereafter, although not shown, finally, working of assembly and others are carried out so that a wireless suspension for HDD is completed.

As shown in FIG. 11(c), a flying lead F is formed by etching polyimide resin layer with a wiring part 16, so that electric conductance can be confirmed from the upper side and from the lower side of the wiring part. The flying lead part F exposes both sides of conducting part to the air. Therefore, the flying lead part F can be used without selecting the upper side or the under side of the wireless suspension blank in certifying the action of magnetic head after assembling the suspension with parts such as magnetic head and slider.

Herein, when insulating layer is worked by the dry-etching method, it is preferable that plasma etching is carried out by means of the plasma etching system shown in FIG. 6.

The construction of the plasma etching system and dry etching by using the plasma etching system is as above-mentioned.

Further, when the working of insulating layer is carried out by the wet-etching method, the following wet-etching method is preferably applied. Namely, if an insulating layer is formed of resin layers of more than two layers, and the ratio of higher etching rate to smaller etching rate is within 6:1 through 1:1, preferably within 4:1 through 1:1, the good shape of etching can be obtained.

Accordingly, if an insulating layer having the construction as the insulating layer in a laminate of wireless suspension blank is used, the good etching can be obtained by the wet etching method.

In this case, etching rate of a core insulating layer of polyimide resin film ("APIKAL NPI" manufactured by Kanegafuchi Chemical Co., Ltd.) and an adhesive layer of polyimide varnish ("EN-20" manufactured by Shin Nippon Rika Co., Ltd) in which the above-mentioned laminate 11 is composed of the core insulating layer and the adhesive layer are about 20 μm/min and 11 μm/min, respectively and the ratio of the two is 20:11, when the laminate is dipped into alkali-amine polyimide etching solution ("TPE-3000" manufactured by Tore Engineering Co., Ltd.). A change in thickness of the two is obtained as the amount of decrease thickness which is a difference between an initial thickness and a thickness of the laminate of after having dipped in the alkali-amine polyimide etching solution, in which initial thickness and the thickness of film at the same area as the area where initial thickness of film are measured by means of the needle-contact thickness meter ("Dektak 16000" manufactured by Sloan Technology Co., Ltd.).

Forming of wiring part 16 and working of metallic layer 12 is carried out for the above-mentioned, and then resists 19 for working insulating layer are formed. Thereafter, an etching solution of alkali-amine polyimide ("TPE-3000" manufactured by Tore Engineering Co., Ltd.) is sprayed on the polyimide resin film and adhesive layer to remove the polyimide resin lyre and adhesive layer as above-mentioned. Thereafter, dry film resists 19 are removed from the laminate by spraying hot alkaline solution of sodium hydroxide at 50° C. at 1 kg of spraying pressure. The laminate which has been wet-etched in such a manner was observed, by which it was certified that etching of both core insulating layer and adhesive layer is satisfactorily carried out. Further, the more satisfactory shape of section can be obtained by dipping polyimide resin film and adhesive layer in the same etching solution to remove the polyimide resin film and the adhesive layer.

As for the laminate in which a polyimide resin film ("KAPTON EN" manufactured by Tore-Dupont Co., Ltd.) with thickness of 12.5 μmis used and the same adhesive layer is used, the etching rate of core insulating layer and adhesive layer in the laminate is about 7 μm/min and 11 μm, respectively. The ratio of the two etching rates is 7:11. The laminate is used and wet etching of insulating layer is carried out through the similar step so that the core insulating layer and the adhesive layer can be etched satisfactorily.

As for the laminate in which, a polyimide resin film with thickness of 12.5 μm("APIKAL NPI" manufactured by Kanegafuchi Chemical Co., Ltd.) is used and polyamic acid varnish ("PAA-A" manufactured by Mithui Chemical Co., Ltd.) is applied on the polyimide resin film in such a manner that the thickness of after having been dried comes to 2.5±0.3 μm to form a film (insulating layer) with adhesive layer and the film with adhesive layer is laminated with the stainless steel as similar as the above-mentioned stainless steel, etching rates of core insulating layer and the adhesive layer are about 20 μm/min and 1 μm/min, respectively. The ratio of the two etching rates is 20:1. Wet etching of insulating layer is carried out using the laminate through the same step. However, etching of adhesive layer cannot be carried out satisfactorily, so that there is left a state that the adhesive layer is projected on the core insulating layer.

According to the present invention, low price production becomes possible by using two-layer laminate. Further, it becomes possible to work a fine wiring part on insulating layer by forming the wiring part by the additive layer.

Further, low cost production becomes possible by carrying out the working of polyimide resin by the wet etching method.

Further, etching with the high working accuracy becomes possible by forming the shape of disc with the curvature in carrying out the working of polyimide resin as insulating layer by plasma etching.

What is claimed is:

1. A method of manufacturing a wireless suspension blank using an initial two-layer laminate comprising an insulating layer having first and second sides wherein said first side defines an exposed face, and said initial two-layer laminate further comprising a metallic layer with a spring property which is provided on said second side of the insulating layer, the method comprising a first step of working the metallic layer by the photo etching method to remove metallic material therefrom, a second step of depositing conductive material onto said exposed face of said insulating layer by the semi-additive method in a pattern which partially covers a portion of said exposed face to add a third layer on said initial two-layer laminate and thereby define a resulting three-layer laminate wherein said pattern of said conductive material defines a wiring part for said wireless suspension blank, and a third step of working the insulating layer of said resulting three-layer laminate after the second step by the wet-etching method to remove insulating material therefrom and form the suspension blank.

2. A method of manufacturing a wireless suspension blank as claimed in claim 1 wherein a polyimide resin layer is used as the insulating layer.

3. A method of manufacturing a wireless suspension blank as claimed in claim 1 wherein the insulating layer is wet-etched from the side of the metallic layer during the third step of wet-etching the insulating layer.

4. A method of manufacturing a wireless suspension blank as claimed in claim 1 wherein wet etching of the insulating layer is carried out from the side of the wiring part during the third step of wet etching the insulating layer.

5. A method of manufacturing a wireless suspension blank as claimed in claim 1 wherein wet etching is carried out from both of the sides of the resulting three-layer laminate wherein said both sides comprise the side of the metallic layer and the side of the wiring part during the third step of wet-etching the insulating layer.

6. A method of manufacturing a wireless suspension blank using an initial two-layer laminate comprising an insulating layer having first and second sides wherein said first side defines an exposed face, and said initial two-layer laminate further comprising a metallic layer having a spring property which is provided on said second side of said insulating layer, the method comprising a first step of working the metallic layer by the photo etching method to remove metallic material therefrom, a second step of depositing conductive material onto said exposed face of said insulating layer by the semi-additive method in a pattern which partially covers a portion of said exposed face to add a third layer on said initial two-layer laminate and thereby define a resulting three-layer laminate wherein said pattern of said conductive material defines a wiring part for said wireless suspension blank, and a third step of working the insulating layer of said resulting three-layer laminate after the second step by the plasma etching method to remove insulating material therefrom and form the suspension blank.

7. A method of manufacturing a wireless suspension blank as claimed in claim 6 wherein a polyimide resin layer is used as the insulating layer.

8. A method of manufacturing a wireless suspension blank as claimed in claim 6 wherein the insulating layer is worked by an electrode with a shape having a curvature during the third step of plasma etching the insulating layer.

9. A method of manufacturing a wireless suspension blank using an initial two-layer laminate comprising an insulating layer having first and second sides wherein said first side defines an exposed face, and said initial two-layer laminate further comprising a metallic layer having a spring property which is provided on said second side of said insulating layer, the method comprising a first step of depositing conductive material onto said exposed face of said insulating layer by the semi-additive method in a pattern which partially covers a portion of said exposed face to add a third layer on said initial two-layer laminate and thereby define a resulting three-layer laminate wherein said pattern of said conductive material defines a wiring part for said wireless suspension blank, a second step of working the metallic layer of said resulting three-layer laminate by the wet-etching method to remove metallic material therefrom and a third step of working the insulating layer of said three-layer laminate after the second step by the dry-etching method or the wet-etching method to remove insulating material therefrom and form the suspension blank.

10. A method of manufacturing a wireless suspension blank as claimed in claim 9 wherein a polyimide resin layer is used as the insulating layer.

11. A method of manufacturing a wireless suspension blank as claimed in claim 9 wherein in the third step, a flying lead part is formed from a flying lead part portion of the wiring part by removing a portion of the insulating layer on which the flying lead portion of the wiring part is formed.

12. A method of manufacturing a wireless suspension blank as claimed in claim 1, further comprising a fourth step of plating the conductive material of the wiring part with a layer of a plating material after the forming of the wiring part by the second step.

13. A method of manufacturing a wireless suspension blank as claimed in claim 6, further comprising a fourth step of plating the conductive material of the wiring part with a layer of a plating material after the forming of the wiring part by the second step.

14. A method of manufacturing a wireless suspension blank as claimed in claim 9, further comprising a fourth step of plating the conductive material of the wiring part with a layer of a plating material after the forming of the wiring part by the first step.

15. A method of manufacturing a wireless suspension blank using an initial multi-layer laminate comprising an insulating layer and a metallic layer with a spring property, said initial multi-layer laminate having opposite side faces wherein one of said laminate side faces is defined by an exposed surface of said insulating layer, the method comprising a first step of working the metallic layer by the photo etching method to remove metallic material therefrom, a second step of depositing conductive wiring material onto said exposed surface of said insulating layer by the semi-additive method in a pattern which partially covers a portion of said exposed surface to add an additional layer to said initial multi-layer laminate wherein said pattern of said conductive wiring material defines a wiring part for said wireless suspension blank, and a third step of working the insulating layer after the second step by the wet-etching method to remove insulating material therefrom and form the suspension blank.

16. A method of manufacturing a wireless suspension blank using an initial multi-layer laminate comprising an insulating layer and a metallic layer having a spring property, said initial multi-layer laminate having opposite side faces wherein one of said laminate side faces is defined by an exposed surface of said insulating layer, the method comprising a first step of working the metallic layer by the photo etching method to remove metallic material therefrom, a second step of depositing conductive wiring material onto said exposed surface of said insulating layer by the semi-additive method in a pattern which partially covers a portion of said exposed surface to add an additional layer to said initial multi-layer laminate wherein said pattern of said conductive wiring material defines a wiring part for said wireless suspension blank, and a third step of working the insulating layer after the second step by the plasma etching method to remove insulating material therefrom and form the suspension blank.

17. A method of manufacturing a wireless suspension blank using an initial multi-layer laminate comprising an insulating layer and a metallic layer having a spring property, said initial multi-layer laminate having opposite side faces wherein one of said laminate side faces is defined by an exposed surface of said insulating layer, the method comprising a first step of depositing conductive wiring material onto said exposed surface of said insulating layer by the semi-additive method in a pattern which partially covers a portion of said exposed surface to add an additional layer to said initial multi-layer laminate wherein said pattern of said conductive wiring material defines a wiring part for said wireless suspension blank, a second step of working the metallic layer by the wet-etching method to remove metallic material therefrom and a third step of working the insulating layer after the second step by the dry-etching method or the wet-etching method to remove insulating material therefrom and form the suspension blank.

* * * * *